(12) United States Patent
Wang et al.

(10) Patent No.: US 8,760,144 B2
(45) Date of Patent: Jun. 24, 2014

(54) MULTIPLE-INPUT COMPARATOR AND POWER CONVERTER

(75) Inventors: Zhao Wang, Beijing (CN); Xianhui Dong, Beijing (CN); Dave Xiaodong Yang, Beijing (CN)

(73) Assignee: Wuxi Vimicro Corporation, Jiangsu (CN)

( * ) Notice: Subject to any disclaimer, the term of this patent is extended or adjusted under 35 U.S.C. 154(b) by 334 days.

(21) Appl. No.: 12/825,084

(22) Filed: Jun. 28, 2010

(65) Prior Publication Data

US 2011/0316507 A1 Dec. 29, 2011

(51) Int. Cl.
*H02M 1/08* (2006.01)
*H03K 5/24* (2006.01)
*H02M 3/156* (2006.01)

(52) U.S. Cl.
CPC .... *H03K 5/2481* (2013.01); *H03F 2203/45374* (2013.01); *H03F 2200/78* (2013.01); *H03F 2203/45392* (2013.01); *H03F 2200/351* (2013.01)
USPC .......................................... 323/317; 323/285

(58) Field of Classification Search
CPC ............... G05F 3/16; G05F 3/20; G05F 3/24; G05F 3/242; G05F 3/245; G05F 3/247; H02M 1/08; H02M 3/156

USPC .............. 327/63, 65, 71, 90, 77, 82; 323/282, 323/284, 285, 311, 312, 313, 314, 317
See application file for complete search history.

(56) References Cited

U.S. PATENT DOCUMENTS

| | | | | |
|---|---|---|---|---|
| 4,823,070 A | * | 4/1989 | Nelson | 323/285 |
| 4,990,799 A | * | 2/1991 | Weiss | 327/65 |
| 5,357,149 A | * | 10/1994 | Kimura | 327/512 |
| 5,563,598 A | * | 10/1996 | Hickling | 341/155 |
| 5,739,678 A | * | 4/1998 | Nagaraj | 323/268 |
| 5,812,020 A | * | 9/1998 | Raghavan et al. | 327/543 |
| 6,057,675 A | * | 5/2000 | Tateishi | 323/283 |
| 6,259,307 B1 | * | 7/2001 | Aram | 327/513 |
| 7,710,413 B2 | * | 5/2010 | Yamamoto | 345/211 |
| 2011/0187344 A1 | * | 8/2011 | Iacob et al. | 323/315 |

* cited by examiner

*Primary Examiner* — Gary L Laxton
(74) *Attorney, Agent, or Firm* — Wuxi Sino IP Agency, Ltd.; Joe Zheng

(57) ABSTRACT

A multiple-input comparator is disclosed. The multiple-input comparator includes a pair of differential transistors connected by a resister. The gate terminals of the transistor pair serve as the input terminals of the comparator for receiving external voltage for comparison. The terminal of the resistor serves as the current input terminal and is either connected to a current source or a current sink. A power inverter utilizing the multiple-input comparator is also disclosed.

15 Claims, 14 Drawing Sheets

MULTIPLE-INPUT COMPARATOR AND POWER CONVERTER

BACKGROUND OF THE INVENTION

1. Field of the Invention

The present invention relates to a field of circuit design, more particularly to multiple-input comparator and power converter circuits.

2. Description of Related Art

In the prior art, a pulse width modulation system usually employs a pulse width modulation (PWM) comparator. FIG. 1 is a schematic diagram showing a comparison principle of the PWM comparator. EAO is an error amplifying (output) signal outputted from an error amplifier. Ramp is a saw-tooth or triangular wave signal. The PWM comparator is provided for comparing an error amplifying signal EAO with the triangular wave signal Ramp to produce a pulse width modulation (output) signal PWMO. When the error amplifying signal EAO is larger than the triangular wave signal Ramp, the PWM signal PWMO is set at high level. When the error amplifying signal EAO is smaller than the triangular wave signal Ramp, the PWM signal PWMO is set at low level. In other words, the signal level of the PWM comparator changes polarity when the error amplifying signal EAO is equal to the triangular wave signal Ramp.

The operation of pulse width modulation is that the PWM system produces the PWM signal PWMO with different duty cycles along with the error amplifying signal EAO. It can be seen from FIG.-1 that the duty cycle of the PWM signal PWMO increases when the error amplifying signal EAO increases, and the duty cycle of the PWM signal PWMO decreases when the error amplifying signal EAO decreases. For various types of power converters, such as DC-DC converters, DC-AC converters or AC-AC converters, a feedback loop circuit is usually employed for adjusting the duty cycle of a power switch. If the triangular wave signal Ramp has a fixed frequency, the modulation of pulse width is equivalent to the modulation of the duty cycle.

The triangular wave signal Ramp usually is generated by an oscillator. A conventional oscillator outputs a saw-tooth wave signal as shown in FIG. 1. A valley voltage of the saw-tooth wave signal is 0 volt. Using a buck DC-DC converter as an example, a duty cycle is required to equal to VO/VIN when a loop circuit is stable, where VO is the output voltage and VIN is the input voltage of the DC-DC converter. When the input voltage VIN is much larger than the output voltage VO–, the required duty cycle for stable loop circuit is very small. If the valley voltage of the saw-tooth wave signal Ramp is equal to 0 volt, the error amplifying signal EAO needs to be near 0 volt when the required duty cycle is very small. Thereby, an output element of the error amplifier may be in the saturation region and the gain of the error amplifier decreased significantly. As a result, the error amplifier does not function normally. Hence, the saw-tooth wave signal Ramp is required to be enhanced by a certain voltage ΔV. FIG. 2 shows two saw-tooth wave signals before and after voltage enhancement. Ramp1 is the saw-tooth wave signal before voltage enhancement, Ramp2 is the saw-tooth wave signal after voltage enhancement, and ΔV is an enhancement voltage.

FIG. 3 is a circuit diagram showing a conventional circuit for enhancing a saw-tooth wave signal Ramp. Referring to FIG. 3, the circuit comprises an operational amplifier OP1, an oscillator, resistors R1 and R2, PMOS transistors MP1, MP2 and MP3, and NMOS transistors MN1, MN2 and MN3. The oscillator produces the unenhanced saw-tooth wave signal Ramp1. An intermediate node 310 between the resistor R2 and the PMOS transistor MP3 is provided as an output terminal for the voltage-enhanced saw-tooth wave signal Ramp2. The saw-tooth wave signal Ramp2 is enhanced by a voltage of V1·(R2/R1) relative to the saw-tooth wave signal Ramp1. However, the circuit is very complicated and is restricted by the responsive speed of the operational amplifier OP1.

For a conventional current mode power converter, the PWM signal is generated either by adding a sampled inductance current to the saw-tooth wave signal Ramp, and comparing the sum with the error amplifying signal EAO from an error amplifier, or by converting the error amplifying signal into a corresponding current signal, and subtracting the sampled inductance current from the corresponding current signal, then converting the difference back into a voltage signal, and comparing the saw-tooth wave signal after voltage enhancement Ramp with the voltage signal.

FIG. 4 is a schematic circuit diagram showing a conventional circuit for generating the PWM signal by subtracting a sampled inductance current ISEN from an EAO of an error amplifier and comparing the difference with the voltage-enhanced saw-tooth wave signal Ramp. Referring to FIG. 4, the circuit comprises an operational amplifier OP2, an oscillator, an enhancement circuit, resistors R3 and R4, PMOS transistors MP11 and MP12, NMOS transistor MN11, a current sampling current source, and a PWM comparator. The resistance values of resistors R3 and R4 may be identical equal. In the circuit shown in FIG. 4, RampSH is the enhanced saw-tooth wave signal Ramp. EAO_ISEN is an output voltage showing the difference between the current sampling signal ISEN and the error amplifying signal EAO. The PWM comparator is provided for comparing the output voltage EAO-_ISEN with the enhanced saw-tooth wave signal RampSH to produce the PWM signal PWMO. The circuit is very complicated and is restricted by the responsive speed of the operational amplifier OP2.

Thus, improved techniques for a PWM comparator are desired to overcome the above disadvantages.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

According to one aspect, the present invention is a multiple-input comparator comprising a pair of differential transistors connected by a resister. The gate terminals of the transistor pair serve as the input terminals of the comparator for receiving external voltage for comparison. The terminal of the resistor serves as the current input terminal and is either connected to a current source or a current sink.

According to another aspect, the present invention is a power converter utilizing the multiple-input comparator. The power inverter comprises a power switch driven by a PMW signal, a voltage sampling circuit, an error amplifier and a multiple-input PWM comparator.

The present invention may be implemented in many forms. According to one embodiment, the present invention is a multiple-input comparator comprising: a first differential transistor having a gate used as a first voltage input terminal of the multiple-input comparator to receive a first voltage; a second differential transistor, forming a differential transistor pair with the first differential transistor, having a gate used as a second voltage input terminal of the multiple-input comparator to receive a second voltage; and a resistor having a first terminal connected to a source terminal of the first differential transistor and a second terminal connected to a source terminal of the second differential transistor; wherein a node between the first terminal of the resistor and the source terminal of the first differential transistor is used as a current input terminal to connect to a current source, or a node between a second terminal of the resistor and the source terminal of the second differential transistor is used as the current input terminal to connect to a current sink According to another embodiment, the present invention is a multiple-input comparator comprising: a first differential transistor having a gate used as a first voltage input terminal to receive a first voltage; a second differential transistor, forming a differential transistor pair with the first differential transistor, having a gate used as a second voltage input terminal to receive a second voltage; a first resistor having a first terminal connected to a source terminal of the first differential transistor; and a second resistor having a first terminal connected to a source terminal of the second differential transistor and a second terminal connected to a second terminal of the first resistor. A node between the first terminal of the first resistor and the source terminal of the first differential transistor is used as a current input terminal to connect to a current source. Alternatively, a node between the first terminal of the second resistor and the source terminal of the second differential transistor is used as a current input terminal to connect to a current sink.

According to yet another embodiment, the present invention is a power converter, comprising: a power conversion stage comprising a power switch driven by a PMW signal to convert an input voltage to an output; a voltage sampling circuit configured for sampling the output voltage to produce a feedback voltage; an error amplifier configured for amplifying an error between the feedback voltage and a reference voltage to produce an error amplifying signal; a multiple-input PWM comparator having a current input terminal connected to a current source or a current sink, a first voltage input terminal coupled with the error amplifying signal and connected to a second voltage input terminal coupled with a saw-tooth wave signal, for comparing the error amplifying signal with the saw-tooth wave signal to produce a PWM signal.

Comparing to the prior arts, with the implementation of a current input the present invention not only is capable of performing complicated comparison functions, but also has much simpler circuit structure. Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims and accompanying drawings, wherein:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Figure 5A:
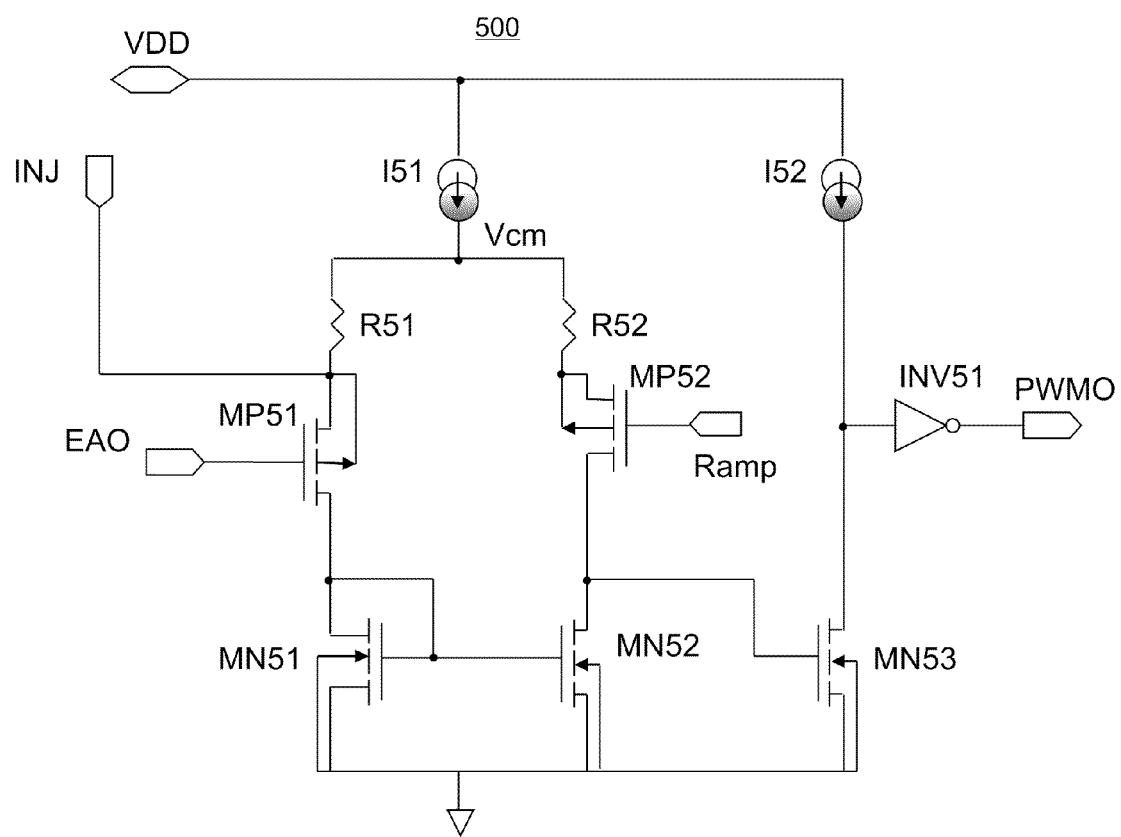
FIG. 5A is a schematic circuit diagram showing a first exemplary configuration of a multiple-input comparator according to a first embodiment of the present invention.

FIG. 5A is a schematic circuit diagram showing a first exemplary configuration of a multiple-input comparator 500 according to a first embodiment of the present invention. Referring to FIG. 5A, the multiple-input comparator 500 comprises a differential transistor pair (MP51 and MP52), a first resistor R51, a second resistor R52 and a current source I51. The length-to-width ratio of the first differential transistor MP51 is equal to that of the second differential transistor MP52.

The first differential transistor MP51 is a PMOS transistor. The gate of the first differential transistor MP51 is used as the first voltage input terminal of the multiple-input comparator 500 to receive the error amplifying voltage EAO. The second differential transistor MP52 is also a PMOS transistor. The gate of the second differential transistor MP52 is used as the second voltage input terminal of the multiple-input comparator 500 to receive the voltage Ramp. One terminal of the first resistor R51 is connected to the source of the first differential transistor MP51, and one terminal of the second resistor R52 is connected to the source of the second differential transistor MP52. The other terminals of the first resistor R51 and the second resistor R52 are connected to the current source I51 at node Vcm.

A node between the first resistor R51 and the first differential transistor MP51 is used as a current input terminal INJ of the multiple-input comparator 500. The current input terminal INJ is connected to a current source. It should be noted that a node connected to a current source means that the current source will inject a current into the node, and that a node connected to a current sink means that the current sink will extract a current from the node.

The multiple-input comparator 500 further comprises NMOS transistors MN51, MN52 and MN53, a current source I52 and an inverter INV51. The NMOS transistor MN51 has its drain connected to the drain of the first differential transistor MP51, its source grounded, and its gate connected to its drain. The NMOS transistor MN52 has its drain connected with the drain of the second differential transistor MP52, its source grounded, and its gate connected to the gate of the NMOS transistor MN51. The NMOS transistors MN51 and MN52 form a current mirror of 1:1. The NMOS transistor MN53 has its drain connected to the current source I52, its source grounded, and its gate connected to the drain of the NMOS transistor MN52. The inverter INV51 has its input terminal connected to the drain of the NMOS transistor MN53 and the current source I52, and its output terminal serves as PWMO voltage output terminal.

The multiple-input comparator changes the polarity of its output when the current passing through the second differential transistor MP52 is equal to the current passing through the NMOS transistor MN52 according to the principle of the comparator. The gate-source voltage Vgs of the first differential transistor MP51 is equal to the gate-source voltage Vgs of the second differential transistor MP52 because the length-to-width ratio of the first differential transistor MP51 is equal to that of the second differential transistor MP52, and the NMOS transistors MN51 and MN52 form a current mirror of 1:1. A circuit analysis of FIG. 5A shows the following:

$$VEAO = Vcm - VR51 - |VGS_{MP51}|,$$

$$VRamp = Vcm - VR52 - |VGS_{MP52}|,$$

$$So, VEAO - VRamp = VR52 - VR51 = R52*(I1 - I_{INJ}) - R51*I1,$$

Then, $VEAO = VRamp + V_{offset1}, V_{offset1} = R52*(I1 + I_{INJ}) - R51*I1$ (1)

where VEAO is the voltage of the error amplifying signal EAO, VRamp is the voltage of the saw-tooth wave signal, VR51 is the voltage drop on the first resistor R51, $VGS_{MP51}$ is the gate-source voltage Vgs of the first differential transistor MP51, $VGS_{MP52}$ is the gate-source voltage Vgs of the second differential transistor MP52, Vcm is the voltage at node Vcm, I1 is the current passing through the first resistor R51, $I_{INJ}$ is the current injected into the current input terminal INJ, and $V_{offset1}$ is the offset voltage.

It can be seen from the formula (1) that the multiple-input comparator 500 carries out a comparison between VEAO and VRamp+$V_{offset}$. In a preferred embodiment, the resistance value (R) of the first resistor R51 is set to equal to that of the second resistor R52. Formula (1) is then reduced to $V_{offset} = R*I_{INJ}$. That is equivalent to enhance VRamp by $R*I_{INJ}$ when $I_{INJ}$ is a direct current. Furthermore, to add a voltage corresponding to a sampled current ISEN to VRamp is achieved when $I_{INJ}$ is the sampled current ISEN. According to another embodiment, the resistance of the first resistor R51 is set to be lower than that of the second resistor R52 to enhance VRamp more easily. The injected current $I_{INJ}$ may be obtained from any reference current source circuits available in various analog chips. For example, the current source connected to the current input terminal INJ may be a current source generation circuit based on constant-gm type, $ÄV_{BE}/R$ type, $V_{th}/R$ type, $V_{BE}/R$ type or band-gap reference. Furthermore, the current source based on band-gap reference provides a more stable enhancement voltage, which is proportional to the band-gap voltage.

According to another embodiment, the length-to-width ratio of the first differential transistor MP51 is set to equal to that of the second differential transistor MP52. The length-to-width ratio of the NMOS transistor MN51 must not be equal to that of the NMOS transistor MN52. As long as the gate-source voltage of the first differential transistor MP51 is equal to that of the second differential transistor MP52, when the multiple-input comparator 500 changes the polarity of its output, the length-to-width ratios of the differential transistor MP51 and MP52 and of the NMOS transistor MN51 and MN52 can be arbitrarily set.

Figure 1:
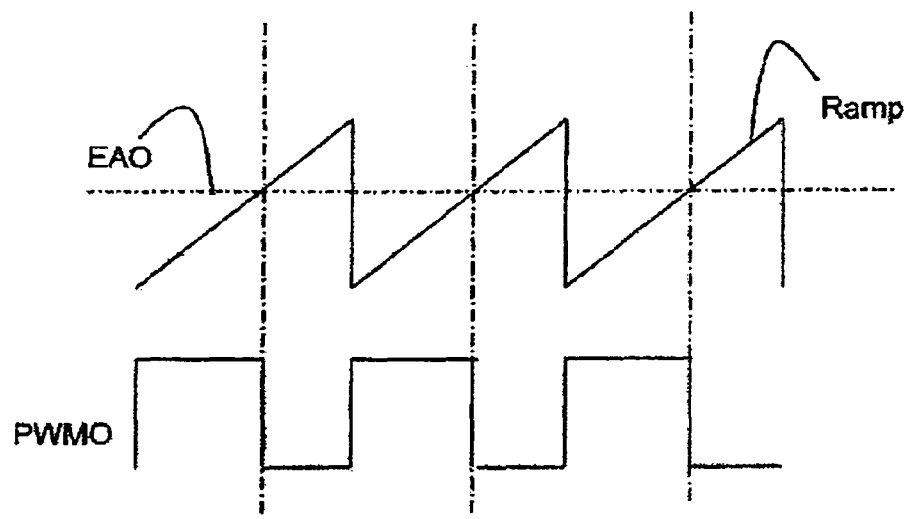
FIG. 1 is a schematic diagram showing a comparison principle of a PWM comparator.
Figure 2:
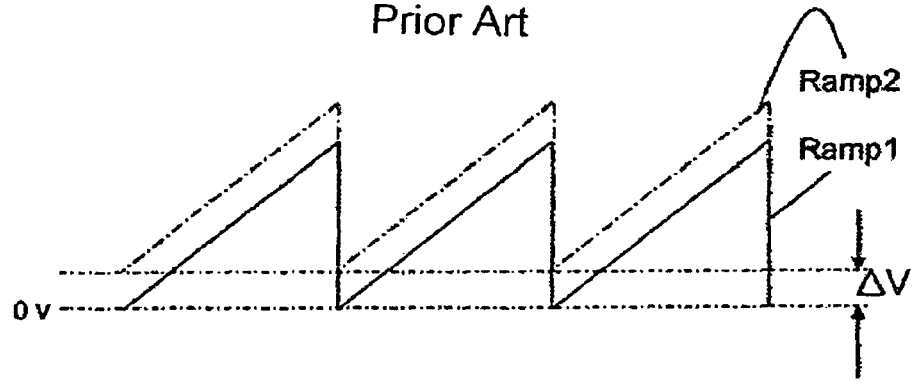
FIG. 2 shows two-tooth wave signals before and after voltage enhancement.
Figure 3:
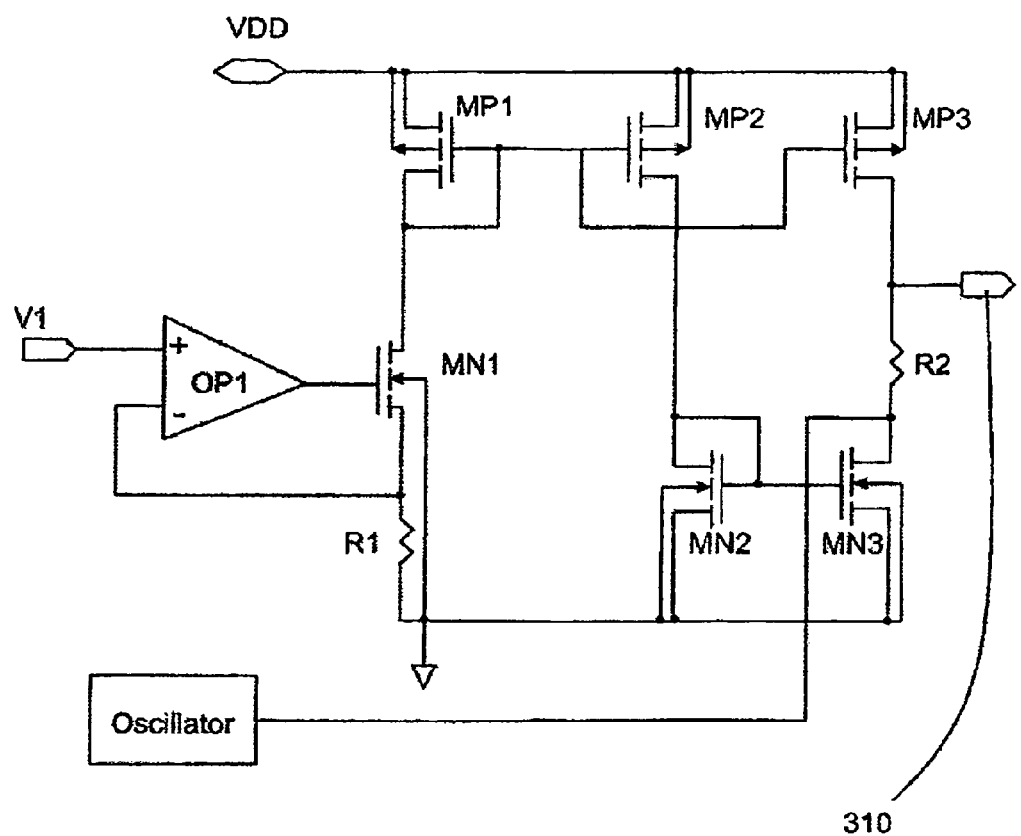
FIG. 3 is a circuit diagram showing a conventional circuit for enhancing a saw-tooth wave signal Ramp.
Figure 4:
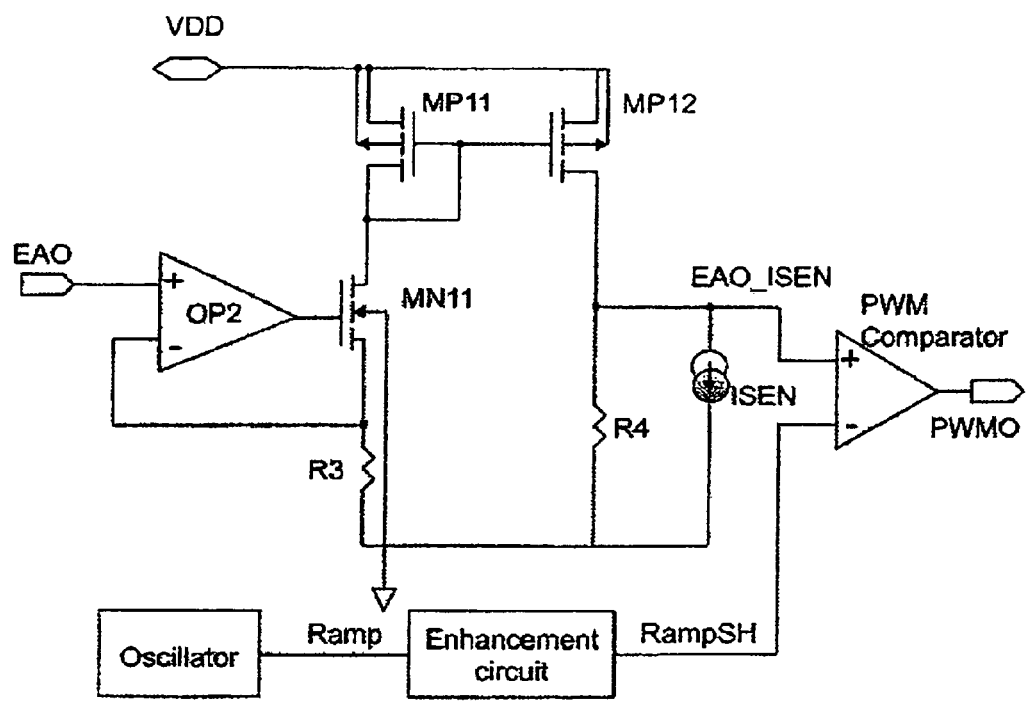
FIG. 4 is a schematic circuit diagram showing a conventional circuit to generate a PWM signal by subtracting a sampled inductance current ISEN from an output signal EAO of an error amplifier and comparing the difference with a voltage-enhanced saw-tooth wave signal Ramp.

Comparing with the prior art, the complicated enhancement circuit with limitation on slow responsive speed shown in FIG. 3 and the complicated circuit for subtracting the sampled current ISEN from the error amplifying signal EAO shown in FIG. 4 are no longer needed in the present invention. With the addition of two resistors and one current input terminal to a conventional comparator, the present invention is able to achieve the same enhancement effects. The disclosed circuit is significantly simplified and the responsive speed is greatly accelerated.

Figure 5B:
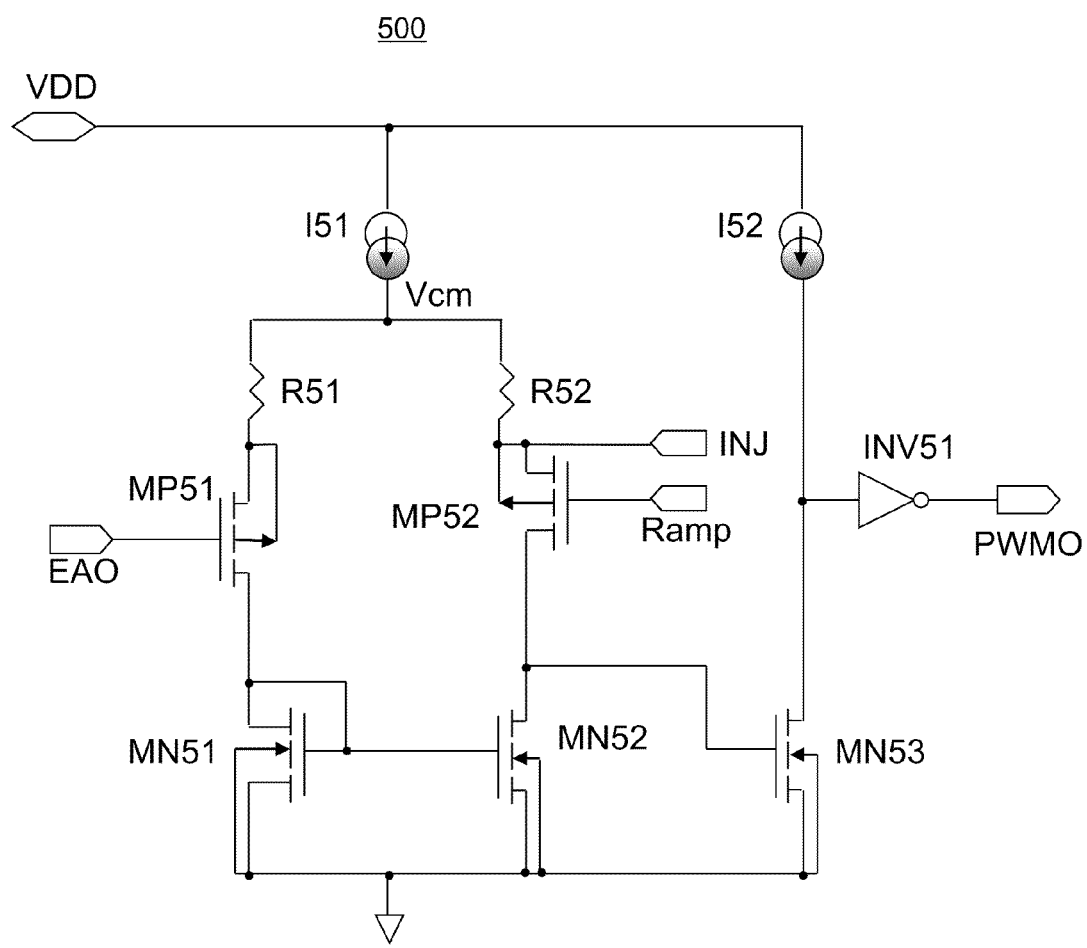
FIG. 5B is a schematic circuit diagram showing a second exemplary configuration of the multiple-input comparator according to the first embodiment of the present invention.

FIG. 5B is a schematic circuit diagram showing a second exemplary configuration of the multiple-input comparator 500 according to the first embodiment of the present invention. Referring to FIGS. 5B and 5A, the multiple-input comparator shown in FIG. 5B is substantially similar to that shown in FIG. 5A, except that a node between the second resistor R52 and the second differential transistor MP52 is used as the current input terminal INJ to connect to a current sink in the multiple-input comparator shown in FIG. 5B. The current sink extracts a current from the current input terminal INJ. Similar to formula (1), VEAO=VRamp+$V_{offset1}$ and $V_{offset1} = R52*(I1 + I_{INJ}) - R51*I1$ are derived from the multiple-input comparator shown in FIG. 5B, where $I_{INJ}$ is modified to indicate the extraction of the sink current.

Figure 5C:
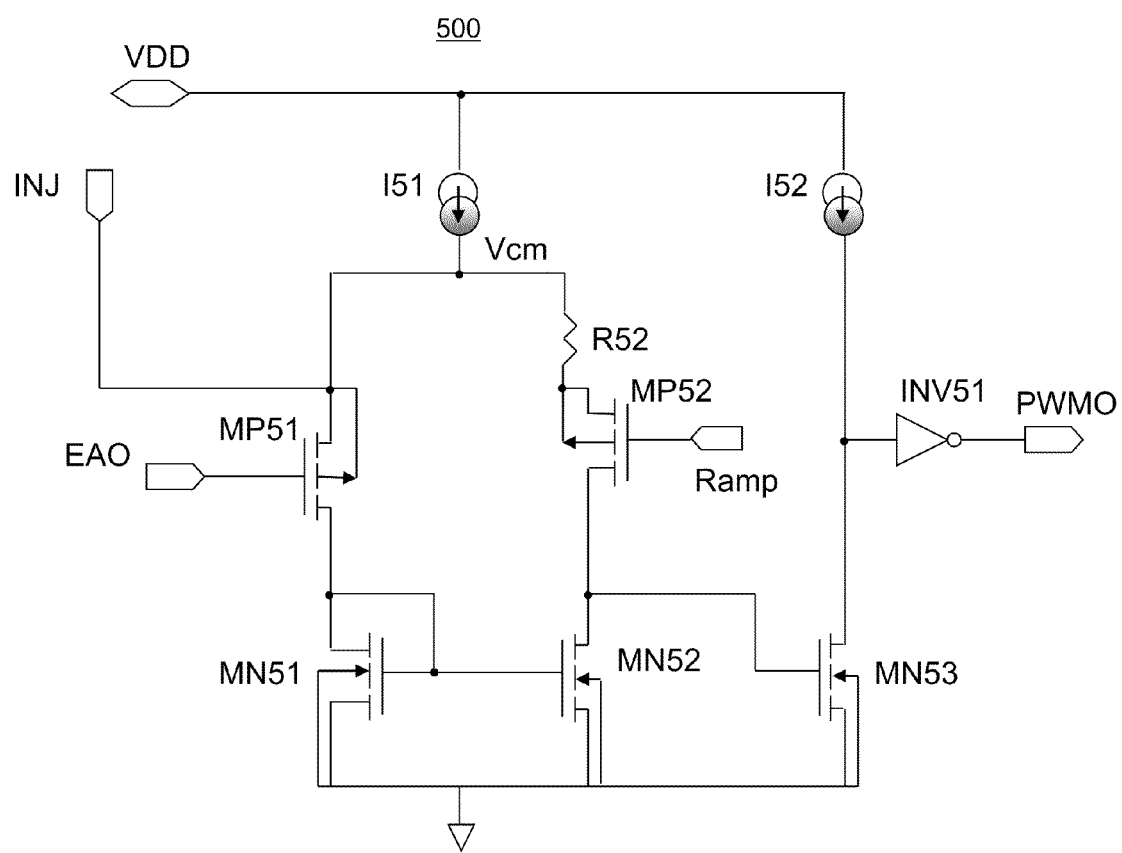
FIG. 5C is a schematic circuit diagram showing a third exemplary configuration of the multiple-input comparator according to the first embodiment of the present invention.

FIG. 5C is a schematic circuit diagram showing a third exemplary configuration of the multiple-input comparator 500 according to the first embodiment of the present invention. Referring to FIGS. 5C and 5A, the multiple-input comparator shown in FIG. 5C is substantially similar to that shown in FIG. 5A, except that the first resistor R51 is not used in the multiple-input comparator shown in FIG. 5C, and that the source of the first differential transistor MP51 is used as the current input terminal INJ. Similar to formula (1), VEAO=VRamp+$V_{offset1}$ and $V_{offset1}$=R52*(I1+$I_{INJ}$)−R51*I1 are derived for the multiple-input comparator shown in FIG. 5C. When the resistance of the first resistor R51 is set to 0, formula (1) is modified to be VEAO=VRamp+$V_{offset1}$ and $V_{offset1}$=R52*(I1+$I_{INJ}$), where I1 is modified to indicate a current flowing into the first differential from the current source I51.

Figure 5D:
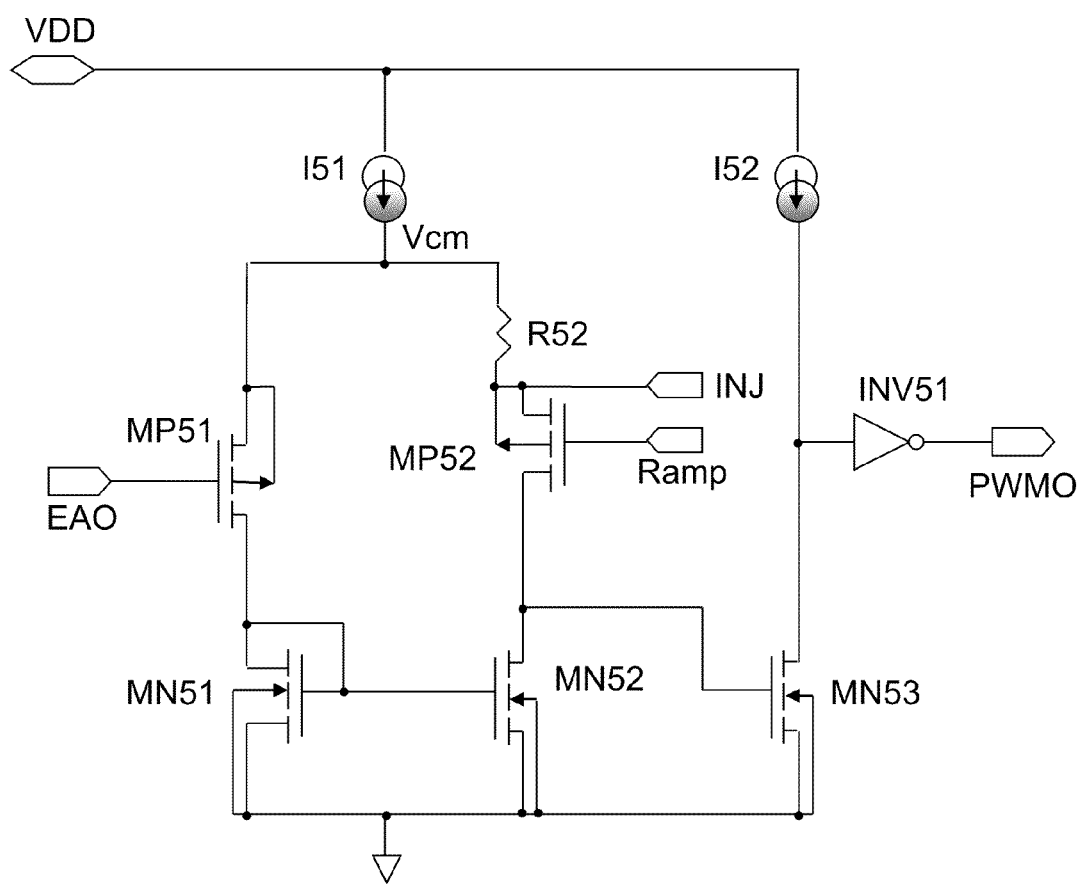
FIG. 5D is a schematic circuit schematic diagram showing a fourth exemplary configuration of the multiple-input comparator according to the first embodiment of the present invention.

FIG. 5D is a schematic circuit diagram showing a fourth exemplary configuration of the multiple-input comparator 500 according to the first embodiment of the present invention. Referring to FIGS. 5D and 5C, the multiple-input comparator shown in FIG. 5D is substantially similar to that shown in FIG. 5C, except that a node between the second resistor R52 and the second differential transistor MP52 is used as the current input terminal INJ to connect to a current sink. The current sink extracts a current from the current input terminal INJ. VEAO=VRamp+$V_{offset1}$ and $V_{offset1}$=R52*(I1+$I_{INJ}$) are derived for the multiple-input comparator shown in FIG. 5D, where $I_{INJ}$ is modified to indicate the extraction of sink current.

The differential transistors MP51 and MP52 shown in FIGS. 5A-5D are not limited to PMOS transistors, any other types of transistors such as NMOS transistors may also be used.

Figure 5E:
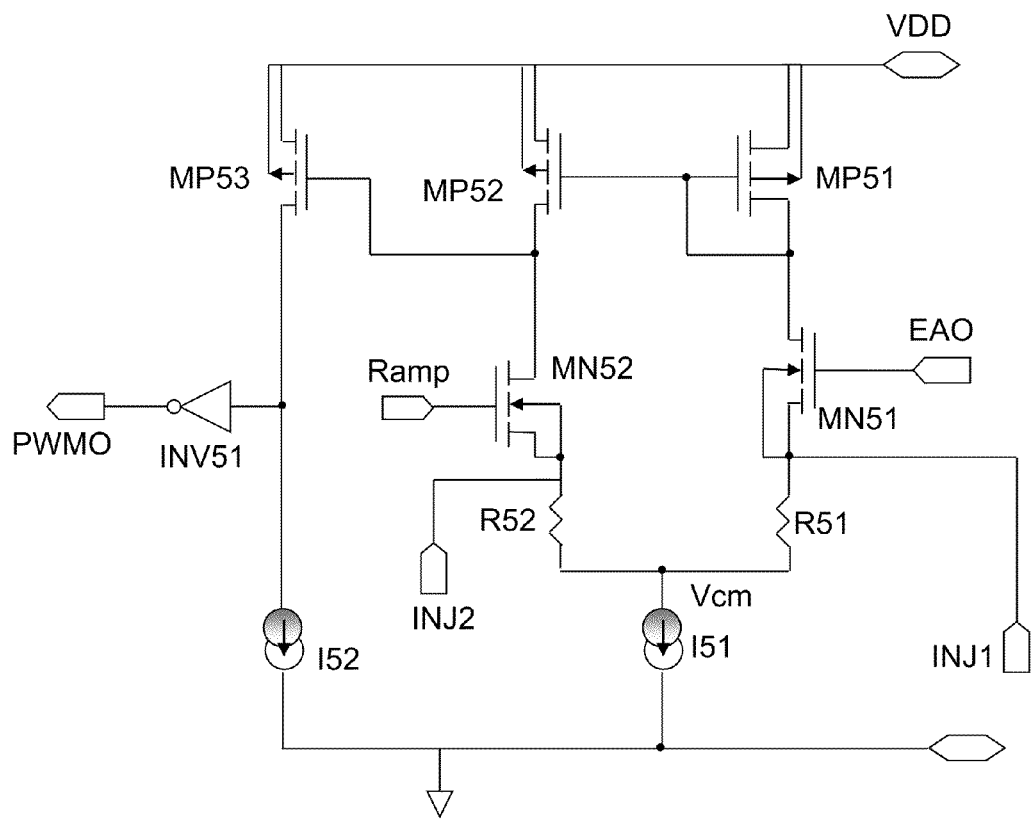
FIG. 5E is a schematic circuit diagram showing a fifth exemplary configuration of the multiple-input comparator according to the first embodiment of the present invention.

FIG. 5E is a schematic circuit diagram showing a fifth exemplary configuration of the multiple-input comparator 500 according to the first embodiment of the present invention. Referring to FIGS. 5E, 5A and 5B, the main differences between the multiple-input comparator shown in FIG. 5E and those shown in FIGS. 5A and 5B are: (1) the differential transistor pair shown in FIGS. 5A and 5B is formed by transistors MP51 and MP52, while in FIG. 5E is formed by transistors MN51 and MN52, and (2) the PMOS transistors are replaced with the NMOS transistors. Referring to FIG. 5E, the current input terminal connects to a current source when node INJ1 between the first resistor R51 and the first differential transistor MN51 is used as the current input terminal. Analysis of the circuit shows the following:

$VEAO=Vcm+VR51+|VGS_{MN51}|$, $VRamp=Vcm+VR52+|VGS_{MN52}|$,

So, $VEAO−VRamp=VR51−VR52=R51*(I2+I_{INJ})−R52*I2$,

Then, $VEAO=VRamp+V_{offset2}, V_{offset2}=R51*(I2+I_{INJ})−R52*I2$ (2)

Where I2 is the current passing through the first resistor R51, $VGS_{MN51}$ is the gate-source voltage Vgs of the first differential transistor MN51, $VGS_{MN52}$ is the gate-source voltage Vgs of the second differential transistor MN52, $I_{INJ}$ is the current injected into the current input terminal INJ, and $V_{offset2}$ is an offset voltage. It can be seen from the formula (2) that the multiple-input comparator shown in FIG. 5E is capable of achieving the same enhancement effects of the Ramp signal as the multiple-input comparator shown in FIG. 5A, where the offset voltage is modified as the difference of subtracting a voltage drop on the second resistor from a voltage drop on the first resistor. Referring to FIG. 5E, when node INJ2 between the second resistor R52 and the second differential transistor MN52 is used as the current input terminal, and connects to a current sink, VEAO=VRamp+$V_{offset2}$, $V_{offset2}$=R51*(I2+$I_{INJ}$)−R52*I2 are derived, where $I_{INJ}$ is modified to indicate the extraction of sink current.

Figure 5F:
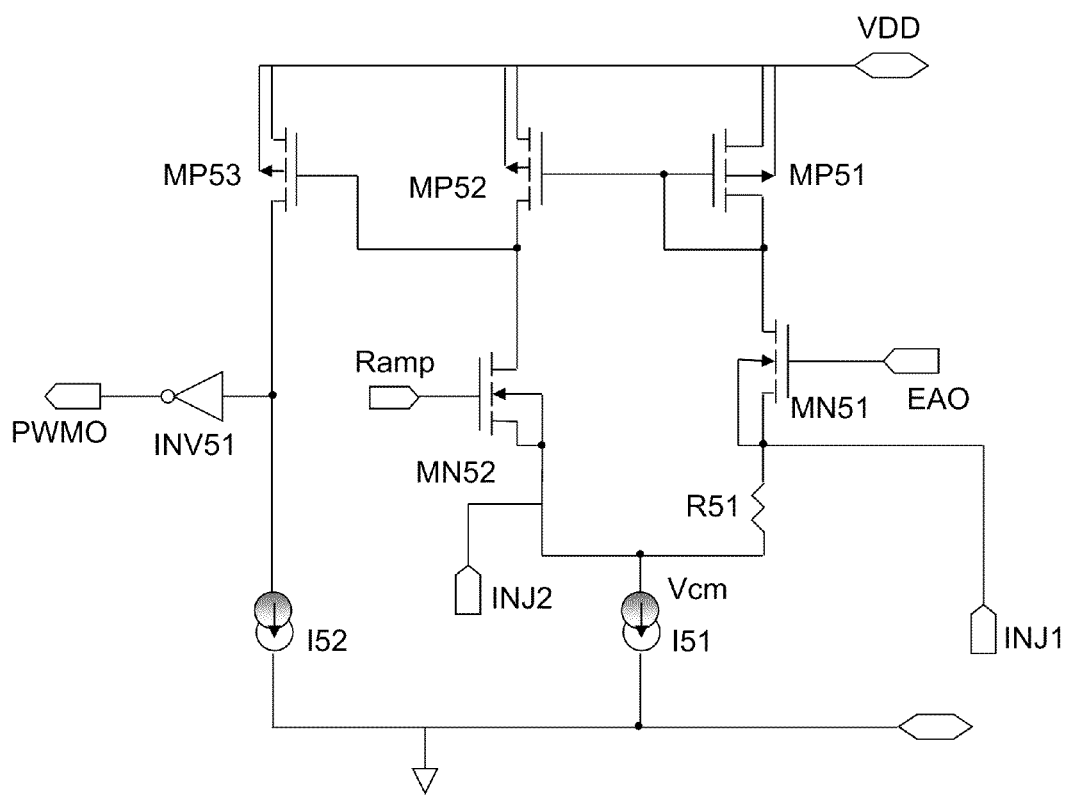
FIG. 5F is a schematic circuit diagram showing a sixth exemplary configuration of the multiple-input comparator according to the first embodiment of the present invention.

FIG. 5F is a schematic circuit diagram showing a sixth exemplary configuration of the multiple-input comparator 500 according to the first embodiment of the present invention, wherein the differential transistors are implemented by NMOS transistors. Referring to FIGS. 5F and 5E, the multiple-input comparator shown in FIG. 5F is substantially similar to that shown in FIG. 5E except that the first resistor R51 is not employed on the multiple-input comparator shown in FIG. 5F. When node INJ1 between the first resistor R51 and the first differential transistor MN51 is used as the current input terminal, and connects to a current source VEAO=VRamp+$V_{offset2}$ and $V_{offset2}$=R51*(I2+$I_{INJ}$)−R52*I2 are derived, wherein the resistance of the second resistor R52 is set as 0. Thus, formula (2) is modified to VEAO=VRamp+$V_{offset2}$ and $V_{offset2}$=R51*(I2+$I_{INJ}$), wherein I2 is the current flowing into the current source I51 from the second differential transistor MN52. When a source INJ2 of the second differential transistor MN52 is used as the current input terminal, the current input terminal connects to a current sink. At this time, VEAO=VRamp+$V_{offset2}$ and $V_{offset2}$=R51*(I2+$I_{INJ}$) are derived, wherein $I_{INJ}$ is the current extracted from the current input terminal INJ2.

Figure 6A:
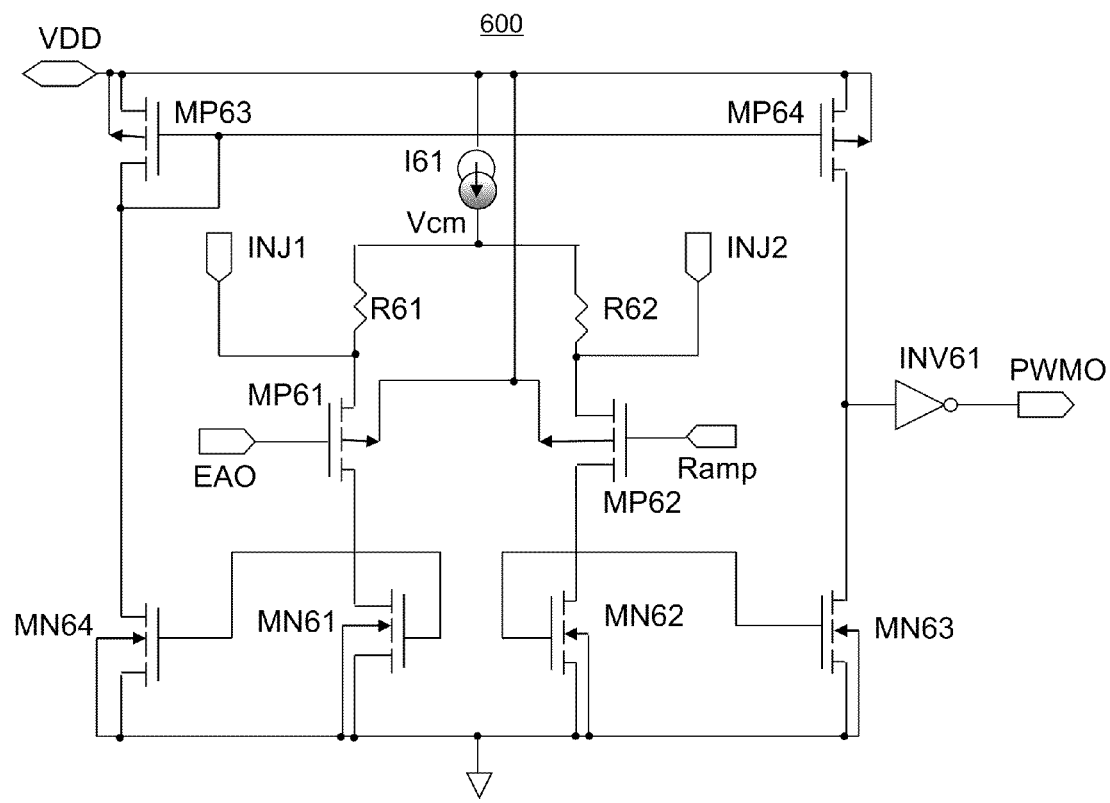
FIG. 6A is a schematic circuit diagram showing a first exemplary configuration of the multiple-input comparator according to a second embodiment of the present invention.

FIG. 6A is a schematic circuit diagram showing a first exemplary configuration of a multiple-input comparator 600 according to a second embodiment of the present invention. Referring to FIGS. 6A, 5A and 5B, comparing the multiple-input comparator 500 shown in FIG. 5A and FIG. 5B, the multiple-input comparator 600 further comprises a first differential transistor MP61, a second differential transistor MP62 to form a differential transistor pair, a first resistor R61, a second resistor R62 and a current source I61. A connection relationship of the electric elements above mentioned is identical with that shown in FIG. 5A and FIG. 5B, which is omitted herein for simplicity. In one embodiment, a node INJ1 between the first resistor R61 and the first differential transistor MP61 is used as the current input terminal to connect to a current source. In another embodiment, a node INJ2 between the second resistor R62 and the second differential transistor MP62 is used as the current input terminal to connect to a current sink.

The multiple-input comparator 600 further comprises PMOS transistors MP63 and MP64, NMOS transistors MN61, MN62, MN63 and MN64, and an inverter INV61. The PMOS transistor MP63 has its source connected to a power supply VDD, a gate connected to the drain. The NMOS transistor MN64 has its source grounded, a drain connected with the drain of the PMOS transistor MP63. The NMOS transistor MN61 has its drain connected to a drain of the first differential transistor MP61, its source grounded, and a gate connected to the gate of the NMOS transistor MN64. The NMOS transistor MN62 has its drain connected to the drain of the second differential transistor MP62, its source grounded. The NMOS transistor MN63 has its source grounded, a gate connected with the gate of the NMOS transistor MN62. The PMOS transistor MP64 has its source connected to the power supply VDD, its gate connected to the gate of the PMOS transistor MP63, and a drain connected to the drain of the NMOS transistor MN63. The inverter INV61 has an input terminal connected to the intermediate node between the PMOS transistor MP64 and the NMOS transistor MN63, and an output terminal used as a voltage output terminal PWMO of the multiple-input comparator 600. The NMOS transistors MN61 and MN64 form a current mirror, the NMOS transistors MN62 and MN63 form a current mirror, and the PMOS transistors MP63 and MP64 form a current mirror.

When the node INJ1 is used as the current input terminal, formula (1) VEAO=VRamp+$V_{offset1}$ and $V_{offset1}$=R52\*(I1+$I_{INJ}$)−R51\*I1 are derived for the multiple-input comparator 600 shown in FIG. 6A. But, the formula (1) is updated as a formula (3) VEAO=VRamp+$V_{offset1}$ and $V_{offset1}$=R62\*(I1+$I_{INJ}$)−R61\*I1, wherein $I_{INJ}$ is an injected current. When the node INJ2 is used as the current input terminal, the formula (3) VEAO=VRamp+$V_{offset1}$ and $V_{offset1}$=R62\*(I1+$I_{INJ}$)−R61\*I1 is also applicable, wherein $I_{INJ}$ is the extracted current.

Figure 6B:
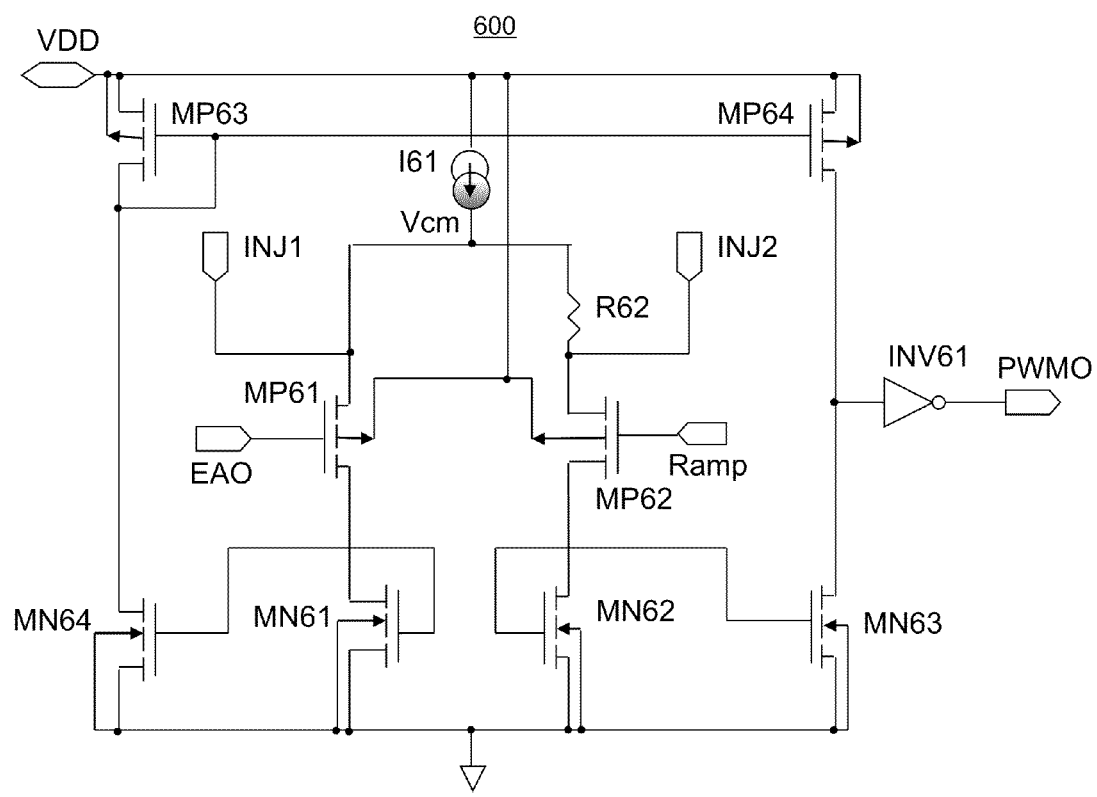
FIG. 6B is a schematic circuit diagram showing a second exemplary configuration of the multiple-input comparator according to the second embodiment of the present invention.

FIG. 6B is a schematic circuit diagram showing a second exemplary configuration of the multiple-input comparator 600 according to the second embodiment of the present invention. Referring to FIG. 6B and FIG. 6A, the multiple-input comparator shown in FIG. 6B is substantially similar to that shown in FIG. 6A except that the first resistor R61 is not employed in the multiple-input comparator shown in FIG. 6B and the source of the first differential transistor MP61 is used as node INJ1. When the node INJ1 is used as the current input terminal, the formula (3) VEAO=VRamp+$V_{offset1}$ and $V_{offset1}$=R62\*(I1+$I_{INJ}$)−R61\*I1 is applicable, where the resistance of the first resistor R61 is set as 0. Thus, formula (3) is modified to VEAO=VRamp+$V_{offset1}$ and $V_{offset1}$=R62\*(I1+$I_{INJ}$), where $I_{INJ}$ is a current injected into the current input terminal. When the node INJ2 is used as the current input terminal, the formulas VEAO=VRamp+$V_{offset1}$ and $V_{offset1}$=R62\*(I1+$I_{INJ}$) are also applicable, where $I_{INJ}$ is a current extracted from the current input terminal.

Figure 7:
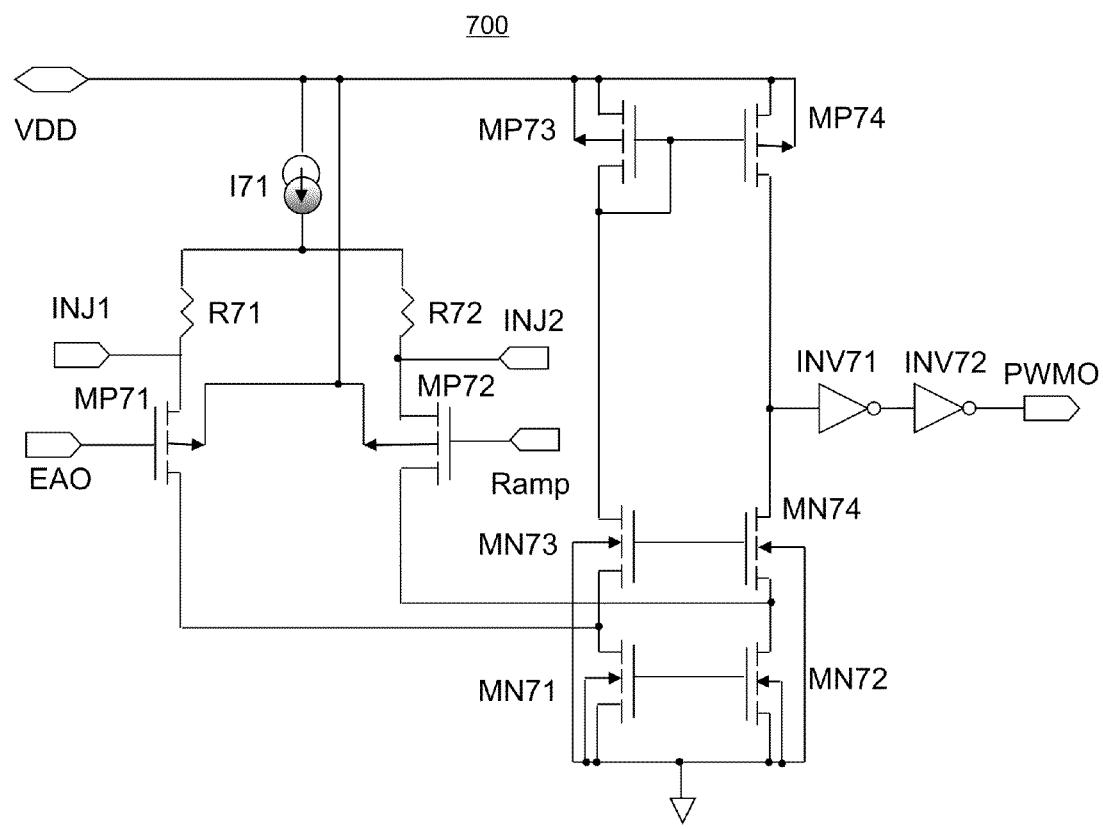
FIG. 7 is a schematic circuit diagram showing an exemplary configuration of the multiple-input comparator according to a third embodiment of the present invention.

FIG. 7 is a schematic circuit diagram showing a multiple-input comparator 700 according to a third embodiment of the present invention. Referring to FIG. 7 and FIG. 6A, comparing to the multiple-input comparator 600, the multiple-input comparator 700 further comprises a first differential transistor MP71, a second differential transistor MP72 forming a differential transistor pair together with a first differential transistor MP71, a first resistor R71, a second resistor R72 and a current source I71. A connection relationship of the electric elements above mentioned is identical with that shown in FIG. 6A, which is omitted herein for simplicity. In one embodiment, a node INJ1 between the first resistor R71 and the first differential transistor MP71 is used as the current input terminal to connect to a current source. In another embodiment, a node INJ2 between the second resistor R72 and the second differential transistor MP72 is used as the current input terminal to connect to a current sink.

The multiple-input comparator 700 further comprises PMOS transistors MP73 and MP74, NMOS transistors MN71, MN72, MN73 and MN74, a first inverter INV71 and a second inverter INV72. The PMOS transistor MP73 has a source connected to a power supply VDD, a gate connected to the drain thereof, and a drain. The NMOS transistor MN73 has its drain connected with the drain of the PMOS transistor MP73. The NMOS transistor MN71 has its drain connected to the source of the NMOS transistor MN73, its source grounded. The PMOS transistor MP74 has its source connected to the power supply VDD, and a gate connected to the gate of the PMOS transistor MP73. The NMOS transistor MN74 has a gate connected to the gate of the NMOS transistor MN73, and a drain connected to the drain of the PMOS transistor MP74. The NMOS transistor MN72 has its source grounded, a gate connected to the gate of the NMOS transistor MN71, and a drain connected to the source of the NMOS transistor MN74. The first inverter INV71 has an input terminal connected to an intermediate node between the PMOS transistor MP74 and the NMOS transistor MN74. The second inverter INV72 has an input terminal connected to the output terminal of the first inverter INV71, and an output terminal used as a PWMO voltage output terminal of the multiple-input comparator 700. The PMOS transistors MP73 and MP74 form a current mirror, the NMOS transistors MN73 and MN74 form a current mirror, and the NMOS transistors MN71 and MN72 form another current mirror.

The formulas VEAO=VRamp+$V_{offset1}$ and $V_{offset1}$=R72\*(I1+$I_{INJ}$)−R71\*I1 are also applicable for the multiple-input comparator 700. According to one embodiment, the resistance of the first resistor R71 is set to 0.

It can be seen that the multiple-input comparator achieves a comparison between the gate voltage VEAO of the first differential transistor and a sum of the gate voltage VRamp of the second differential transistor and the offset voltage by connecting the first resistor and/or the second resistor to the source terminals of the first differential transistor and/or the second differential transistor. The above configuration can be applied in the input stages of all types of conventional comparators.

According to another embodiment, the differential transistor pair shown in FIGS. 7, 6A and 6B can be implemented with NMOS transistors.

Figure 8A:
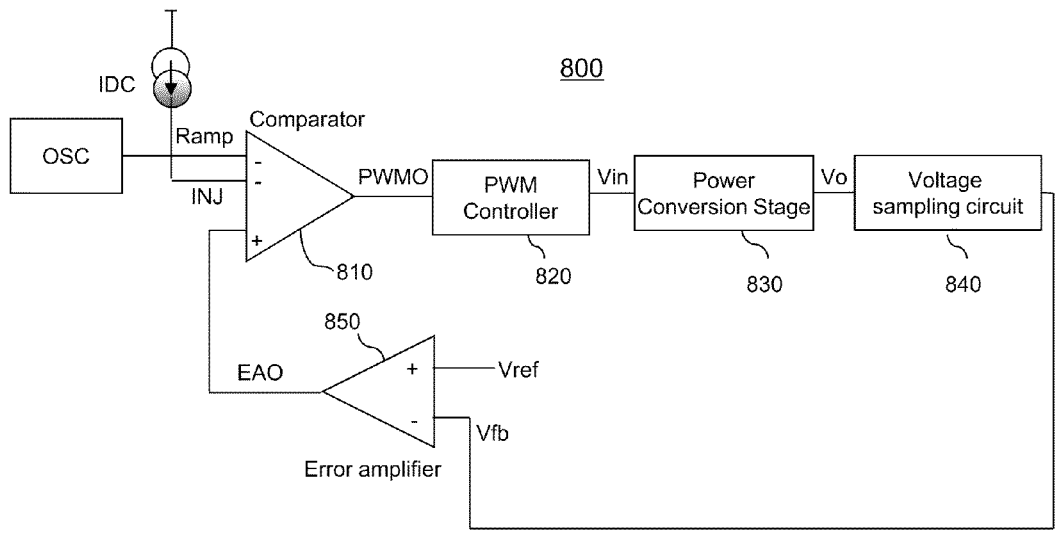
FIG. 8A is a schematic circuit diagram showing a first exemplary configuration of a power converter according to one embodiment of the present invention.

FIG. 8A is a schematic circuit diagram showing a first exemplary configuration of a power converter 800 according to one embodiment of the present invention. Referring to FIG. 8A, the power converter 800 comprises a multiple-input comparator 810, a power conversion stage 830, a voltage sampling circuit 840 and an error amplifier 850. The multiple-input comparator 810 can be anyone of the multiple-input comparators shown in FIGS. 5A-7. As described above, the multiple-input comparator 810 comprises a first voltage input terminal, a second voltage input terminal and a current input terminal INJ. The current input terminal INJ is connected to a direct current source IDC. An error amplifying signal EAO is used as the first voltage to couple with the first voltage input terminal. A saw-tooth wave signal Ramp is used as the second voltage to couple with the second voltage input terminal. The multiple-input comparator 810 is provided for comparing the error amplifying signal EAO with the saw-tooth wave signal Ramp to produce a PWM signal. The power conversion stage 830, comprising a power switch (not shown), is provided for converting an input voltage to an output voltage under the control of the power switch, which is driven by the PMW signal. The voltage sampling circuit 840 is provided for sampling the output voltage of the power converter to obtain a feedback voltage Vfb. The error amplifier 850 is provided for amplifying an error signal between the feedback voltage Vfb and a reference voltage Vref to produce the error amplifying signal EAO. According to one embodiment, the saw-tooth wave signal Ramp is generated by the oscillator OSC, and the PWM signal drives the power switch via a PWM controller 820. The PWM signal outputted from the multiple-input comparator 810 changes in polarity of thereof when the error amplifying signal EAO is equal to the sum of the saw-tooth wave signal Ramp and the offset voltage, which is proportional to the current injected into the current input terminal.

Figure 8B:
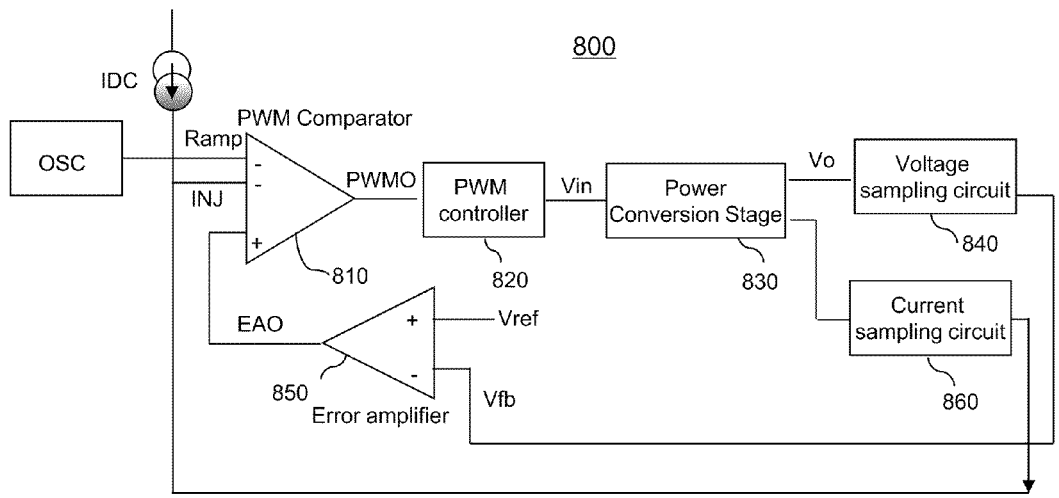
FIG. 8B is a schematic circuit diagram showing a second exemplary configuration of the power converter according to one embodiment of the present invention.

FIG. 8B is a schematic circuit diagram showing a second exemplary configuration of the power converter 800 according to one embodiment of the present invention. Referring to FIGS. 8B and 8A, the power converter shown in FIG. 8B is substantially similar to that shown in FIG. 8A except that the power converter shown in FIG. 8B further comprises a current sampling circuit 860 for sampling the current passing through the power switch. The current being sampled by the current sampling circuit 860 is coupled to the current input terminal INJ as a current source.

Figure 8C:
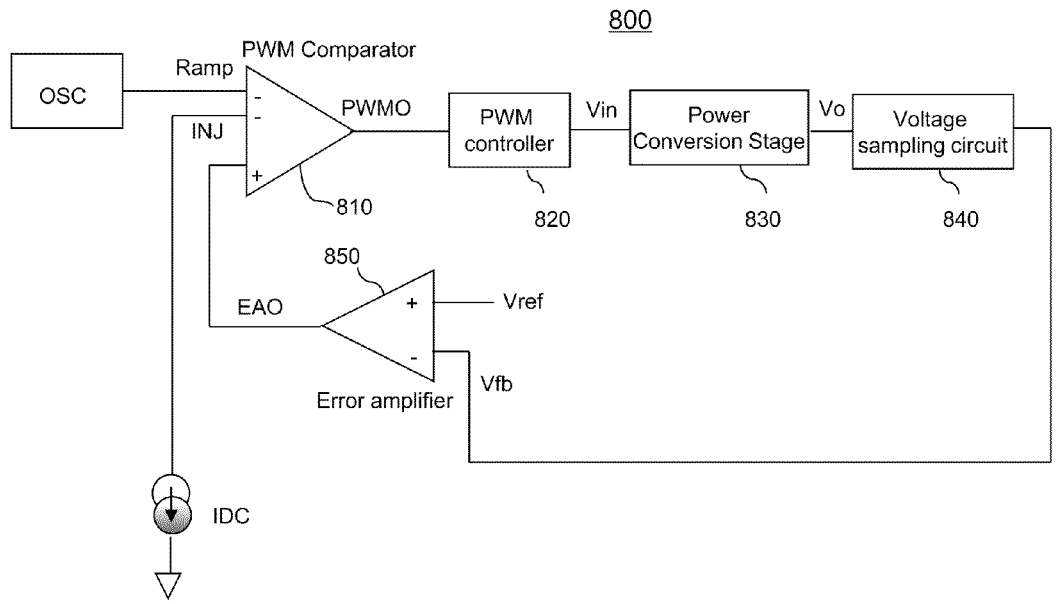
FIG. 8C is a schematic circuit diagram showing a third exemplary configuration of the power converter according to one embodiment of the present invention.

FIG. 8C is a schematic circuit diagram showing a third exemplary configuration of the power converter 800 according to one embodiment of the present invention. Referring to FIGS. 8C and 8A, the power converter shown in FIG. 8C is substantially similar to that shown in FIG. 8A except that the direct current source IDC is connected to the current input terminal as a current sink.

Figure 8D:
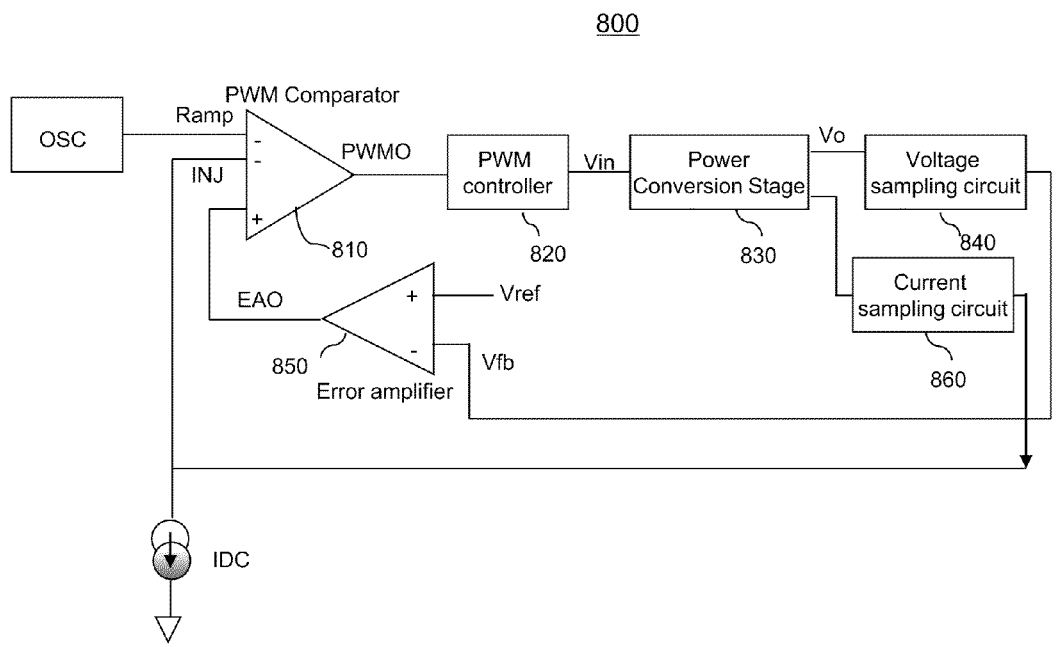
FIG. 8D is a schematic circuit diagram showing a fourth exemplary configuration of the power converter according to one embodiment of the present invention.

FIG. 8D is a schematic circuit diagram showing a fourth exemplary configuration of the power converter 800 according to one embodiment of the present invention. Referring to FIGS. 8D and 8B, the power converter shown in FIG. 8D is substantially similar to that shown in FIG. 8B except that the direct current source IDC and the current sampled by the current sampling circuit 860 are coupled to the current input terminal INJ as a current sink.

As described above, a current input is employed in the comparator in the present invention. Thereby, the comparator not only capable of performing complicated comparison functions, but also has simple structure.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. A circuit comprising:
   a first differential transistor having a gate used as a first voltage input terminal of the circuit to receive a first voltage and coupled to a first load transistor;
   a second differential transistor forming a differential transistor pair with the first differential transistor, having a gate used as a second voltage input terminal of the circuit to receive a second voltage and coupled to a second load transistor, wherein respective length-to-width ratios of the first and second differential transistors are identical while respective length-to-width ratios of the first and second load transistors are not identical; and
   a resistor having a first terminal connected to a source terminal of the first differential transistor, and a second terminal connected to a source terminal of the second differential transistor, wherein a node between the first terminal of the resistor and the source terminal of the first differential transistor is used as a current input terminal to connect to a current source, or a node between the second terminal of the resistor and the source terminal of the second differential transistor is used as the current input terminal to connect to a current sink.

2. The circuit according to claim 1, further comprising the current source connected to the source of the first differential transistor, wherein the first differential transistor and the second differential transistor are PMOS transistors or NMOS transistors.

3. The circuit according to claim 1, wherein the circuit is a multiple-input comparator producing an output that changes polarity thereof when the first voltage is equal to a sum of the second voltage and a voltage drop across the resistor.

4. The circuit according to claim 3, wherein the current source injects a current into the current input terminal to cause the voltage drop across the resistor, or wherein the current sink extracts a current from the current input terminal to cause the voltage drop on the resistor.

5. A circuit comprising:
   a first differential transistor having a gate used as a first voltage input terminal to receive a first voltage, and coupled to a first load transistor;
   a second differential transistor, forming a differential transistor pair with the first differential transistor, having a gate used as a second voltage input terminal to receive a second voltage, and coupled to a second load transistor, wherein respective length-to-width ratios of the first and second differential transistors are identical while respective length-to-width ratios of the first and second load transistors are not identical;
   a first resistor having a first terminal connected to a source terminal of the first differential transistor; and
   a second resistor having a first terminal connected to a source terminal of the second differential transistor, and a second terminal connected to a second terminal of the first resistor, wherein a node between the first terminal of the first resistor and the source terminal of the first differential transistor is used as a current input terminal to connect to a current source, or a node between the first terminal of the second resistor and the source terminal of the second differential transistor is used as a current input terminal to connect to a current sink.

6. The circuit according to claim 5, further comprising the current source connected to an intermediate node between the first resistor and the second resistor.

7. The circuit according to claim 5, wherein the circuit is a multiple input comparator producing an output that changes polarity thereof when the first voltage is equal to a sum of the second voltage and a voltage drop difference across the first resistor and the second resistor.

8. The circuit according to claim 7, wherein the current source injects a current into the current input terminal causing the voltage drop difference across the first and the second resistors, or wherein the current sink extracts a current from the current input terminal causing the voltage drop difference across the first and the second resistors.

9. The circuit according to claim 8, wherein
   the first transistor has a drain terminal connected to a drain of the first differential transistor, a source terminal grounded, and a gate connected with the drain terminal;
   the second transistor has a drain terminal connected to a drain of the second differential transistor, a source terminal grounded, and a gate connected to the gate of the first transistor;
   the third transistor has a gate connected to the current source, a source terminal grounded, and a gate connected to the drain of the second transistor; and
   the inverter has an input terminal connected to an intermediate node between the current source and the third transistor, and an output terminal used as a voltage output terminal of the multiple-input comparator.

10. The circuit according to claim 8, wherein
    the first transistor has a source connected with a power supply, a gate connected with the drain thereof, and a drain;
    the second transistor has a source terminal grounded, a drain connected to the drain of the first transistor;
    the third transistor has a drain connected to a drain of the first differential transistor, a source terminal grounded, and a gate connected to the gate of the second transistor;
    the fourth transistor having has a drain connected to a drain of the second differential transistor, a source terminal grounded;

the fifth transistor a source terminal grounded, a gate connected to the gate of the fourth transistor;
the sixth transistor has a source terminal connected to the power supply, a gate connected to the gate of the first transistor, and a drain connected to the drain of the fifth transistor; and
the inverter has an input terminal connected to an intermediate node between the fifth transistor and the sixth transistor, and an output terminal used as a voltage output terminal of the multiple input comparator; and the second and the third transistors, the fourth and the fifth transistors, and the first and the sixth transistor form three separate current mirrors.

11. The circuit according to claim 8, further comprising a third transistor, a fourth transistor, a fifth transistor, a sixth transistor, a first inverter and a second inverter, the first transistor having a source terminal connected to a power supply, a gate and a drain connected together; the third transistor having a drain connected to the drain of the first transistor; the fifth transistor having a drain connected to the source of the third transistor, a source terminal grounded; the second transistor having a source connected to the power supply, and a gate connected to the gate of the first transistor; the fourth transistor having a gate connected to the gate of the third transistor, and a drain connected to the drain of the second transistor; the sixth transistor having a source terminal grounded, a gate connected to the gate of the fifth transistor, and a drain connected to the source terminal of the fourth transistor; the first inverter having an input terminal connected to an intermediate node between the second transistor and the fourth transistor, and an output terminal; the second inverter having an input terminal connected to the output terminal of the first inverter, and an output terminal used as a voltage output terminal of the multiple-input comparator; and the second and the first transistors, the third and the fourth transistors, and the fifth and the sixth transistor form three separate current mirrors.

12. A circuit comprising:
a power conversion stage comprising a power switch driven by a PMW signal to convert an input voltage to an output;
a voltage sampling circuit configured for sampling the output voltage to produce a feedback voltage;
an error amplifier configured for amplifying an error between the feedback voltage and a reference voltage to produce an error amplifying signal;
a multiple-input comparator having a current input terminal connected to a current source or a current sink,
a first voltage input terminal coupled with the error amplifying signal and connected to a second voltage input terminal coupled with a saw-tooth wave signal, for comparing the error amplifying signal with the saw-tooth wave signal to produce the PWM signal;
wherein the multiple-input comparator comprises:
a first differential transistor having a gate used as the first voltage input terminal to receive a first voltage;
a second differential transistor forming a differential transistor pair with the first differential transistor and having a gate used as the second voltage input terminal to receive a second voltage; and
a resistor having a first terminal connected to a source terminal of the first differential transistor, and a second terminal connected to a source terminal of the second differential transistor;
wherein a node between the first terminal of the resistor and the first differential transistor is used as the current input terminal to connect to the current source; or a node between the second terminal of the resistor and the second differential transistor is used as the current input terminal to connect with the current sink; and wherein the multiple-input comparator turns over when the first voltage is equal to a sum of the second voltage and a voltage drop across the resistor.

13. The circuit according to claim 12, wherein the current source injects a current into the current input terminal to cause the voltage drop across the resistor, or wherein the current sink extracts a current from the current input terminal to cause the voltage drop across the resistor.

14. A circuit comprising:
a power conversion stage comprising a power switch driven by a PMW signal to convert an input voltage to an output;
a voltage sampling circuit configured for sampling the output voltage to produce a feedback voltage;
an error amplifier configured for amplifying an error between the feedback voltage and a reference voltage to produce an error amplifying signal;
a multiple-input comparator having a current input terminal connected to a current source or a current sink,
a first voltage input terminal coupled with the error amplifying signal and connected to a second voltage input terminal coupled with a saw-tooth wave signal, for comparing the error amplifying signal with the saw-tooth wave signal to produce the PWM signal;
wherein the multiple-input comparator comprises:
a first differential transistor having a gate used as the first voltage input terminal to receive a first voltage;
a second differential transistor forming a differential transistor pair with the first differential transistor and having a gate used as the second voltage input terminal to receive a second voltage;
a first resistor having a first terminal connected to a source terminal of the first differential transistor; and
a second resistor having a first terminal connecting to a source terminal of the second differential transistor, and a second terminal connected to a second terminal of the first resistor;
wherein a node between the first terminal of the first resistor and the source terminal of the first differential transistor is used as the current input terminal to connect to the current source; or a node between the first terminal of the second resistor and the source terminal of the second differential transistor is used as the current input terminal to connect to the current sink; and
wherein the multiple-input comparator producing an output that changes that changes polarity thereof when the first voltage is equal to a sum of the second voltage and a voltage drop difference between the first resistor and the second resistor.

15. The circuit according to claim 14, wherein the current source injects a current into the current input terminal to cause a voltage drop difference between the first resistor and the second resistor, or wherein the current sink extracts a current from the current input terminal to cause a voltage drop difference between the first resistor and the second resistor.

* * * * *